(12) United States Patent
Krause et al.

(10) Patent No.: US 7,015,095 B2
(45) Date of Patent: Mar. 21, 2006

(54) METHOD FOR FABRICATING A SEMICONDUCTOR MEMORY HAVING CHARGE TRAPPING MEMORY CELLS AND SEMICONDUCTOR SUBSTRATE

(75) Inventors: Mathias Krause, Dresden (DE); Christoph Ludwig, Langebrück (DE); Jens-Uwe Sachse, Dresden (DE); Joachim Deppe, Dresden (DE); Ralf Richter, Kunzell (DE); Christoph Kleint, Dresden (DE); Ricardo Mikalo, Waltersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/856,414

(22) Filed: May 27, 2004

(65) Prior Publication Data

US 2005/0003613 A1   Jan. 6, 2005

(30) Foreign Application Priority Data

May 27, 2003   (DE) ............................... 103 24 052

(51) Int. Cl.
*H01L 21/336* (2006.01)
(52) U.S. Cl. ................. 438/257; 438/305; 438/306
(58) Field of Classification Search ................ 438/257, 438/268, 288, 291, 299, 301, 305, 306
See application file for complete search history.

(56) References Cited

U.S. PATENT DOCUMENTS

| 5,597,753 A | * | 1/1997 | Sheu et al. ................. 438/275 |
| 5,679,591 A | | 10/1997 | Lin et al. |
| 5,768,192 A | | 6/1998 | Eitan |
| 6,011,725 A | | 1/2000 | Eitan |
| 6,211,012 B1 | | 4/2001 | Lee et al. |
| 6,555,922 B1 | * | 4/2003 | Nakagawa .................. 257/786 |
| 6,630,746 B1 | * | 10/2003 | Mancini et al. ............. 257/797 |
| 2002/0149958 A1 | | 10/2002 | Kuniklyo |
| 2003/0209767 A1 | * | 11/2003 | Takahashi et al. .......... 257/797 |
| 2005/0006710 A1 | * | 1/2005 | Riedel ........................ 257/390 |

FOREIGN PATENT DOCUMENTS

WO   WO 99/60631   11/1999

* cited by examiner

*Primary Examiner*—Phuc T. Dang
(74) *Attorney, Agent, or Firm*—Slater & Matsil, L.L.P.

(57) ABSTRACT

Electrically conductive material is introduced into interspaces between the word lines (2) and is partially removed using a mask (6) in such a way that residual portions (7) of the conductive material in each case fill a section of the relevant interspace and produce an electrical contact with source/drain regions (15). With further portions of the conductive material, it is possible to form alignment marks for the fabrication process.

16 Claims, 3 Drawing Sheets

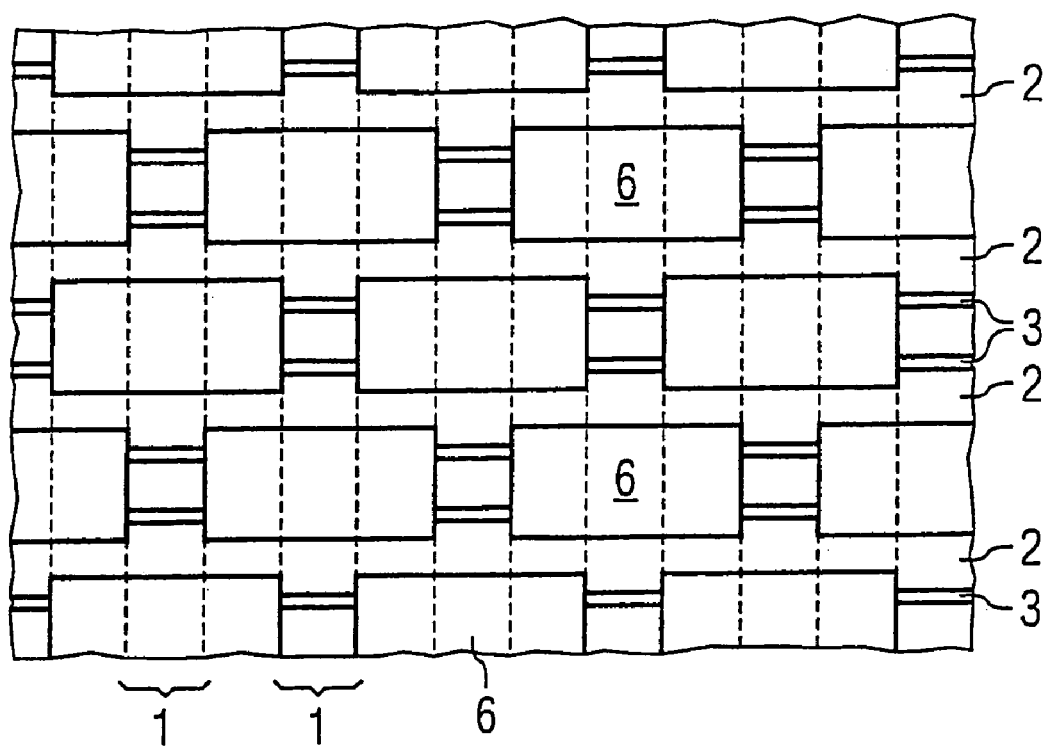

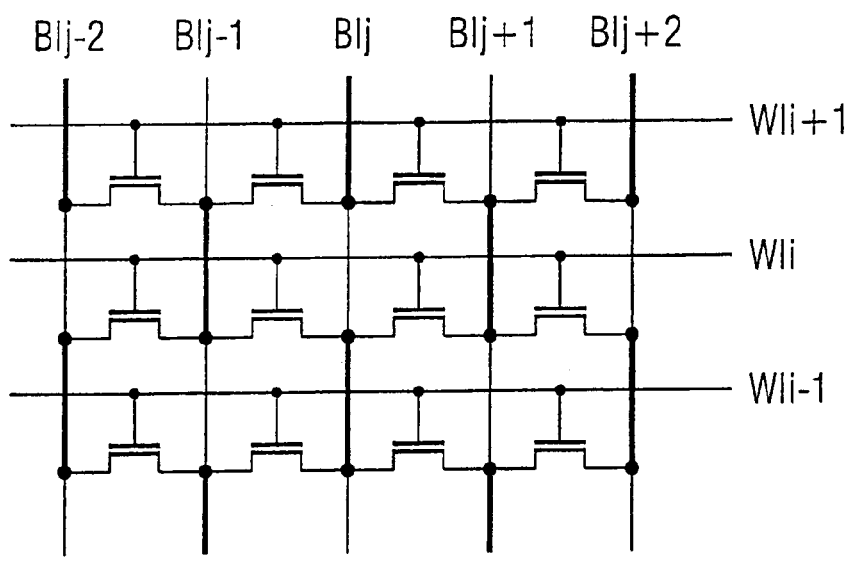
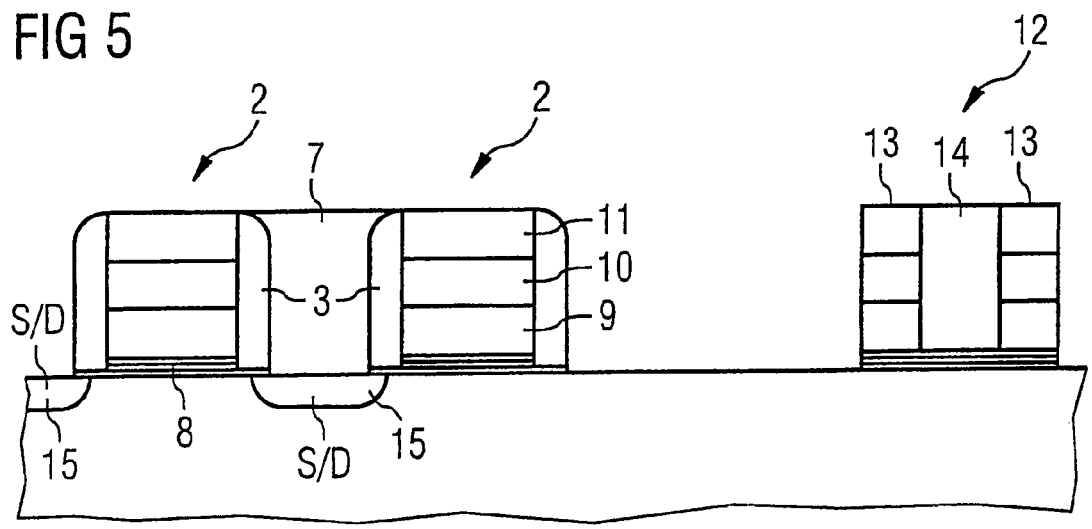

METHOD FOR FABRICATING A SEMICONDUCTOR MEMORY HAVING CHARGE TRAPPING MEMORY CELLS AND SEMICONDUCTOR SUBSTRATE

TECHNICAL FIELD

The present invention relates generally to semiconductor devices and methods and more particularly to a method for fabricating a semiconductor memory having charge trapping memory cells.

BACKGROUND

Charge trapping memory cells, such as planar SONOS memory cells or NROM memory cells are discussed in U.S. Pat. Nos. 5,768,192 and 6,011,725 or International Publication No. WO 99/60631. These devices have an oxide-nitride-oxide storage layer sequence as gate dielectric and are programmed by channel hot electrons (CHE) and erased by hot holes. A virtual ground array comprising NROM cells is usually provided with word lines which run above the source/drain regions and cross with buried bit lines. The transistor current therefore flows parallel to the word lines. This results in various difficulties: the memory transistors cannot be optimized by a precise setting of the source/drain dopings. The word lines have a small cross section, so that fast access to the memory contents is not possible owing to the low electrical conductivity caused as a result of said small cross section.

U.S. Pat. No. 5,679,591 describes a method for fabricating a contactless semiconductor memory with bit lines on the top side, in which bit line strips are in each case arranged between the word line stacks and interconnect the source/drain regions of the successive memory transistors along the word lines. The channel regions are oriented transversely with respect to the word lines and are isolated from one another by trench isolations.

SUMMARY OF THE INVENTION

In one aspect, the present invention provides a method for fabricating semiconductor memories having charge trapping memory cells in a virtual ground architecture.

In a preferred embodiment method, in a first step, at a top side of a semiconductor body or substrate, in an arbitrary order, a concentration of dopant that suffices for forming channel regions of memory transistors is provided and an arrangement of strip-type STI isolations arranged parallel at a distance from one another is fabricated. In a second step, a dielectric storage layer sequence comprising a first boundary layer, an actual storage layer and a second boundary layer is applied. In a third step, electrically conductive material is applied and patterned together with an insulation layer on the top side to form word lines, which run parallel at a distance from one another transversely with respect to the STI isolations. In a fourth step, lateral insulations of the word lines are provided, and an implantation of dopant is performed by means of which the source/drain regions of the transistors are fabricated between the STI isolations and the word lines. In a fifth step, electrically conductive material is introduced into interspaces between the word lines and is partially removed using a mask in such a way that residual portions of the conductive material in each case fill a section of the relevant interspace and produce an electrical contact with, in each case, at least one of the source/drain regions.

In a further step, portions of a dielectric material may, in each case, be introduced into the interspaces between the word lines and the residual portions of the electrically conductive material.

Preferably, in the fifth step, the electrically conductive material is patterned in such a way that, in accordance with a consecutive numbering of the source/drain regions along a respective word line, in the case of which the source/drain regions which are not arranged on different sides of an STI isolation each acquire the same number, on one side of the word line in each case an even-numbered source/drain region is electrically conductively connected to the subsequent odd-numbered source/drain region in such consecutive numbering, and on the opposite side of this word line, in each case an odd-numbered source/drain region is electrically conductively connected to the subsequent even-numbered source/drain region in such consecutive numbering. The cross-connections thus fabricated, which in each case bridge a strip-type STI isolation, may have applied to them bit lines which are arranged parallel at a distance from one another and transversely with respect to the word lines and may be contact-connected with the cross-connections in such a way that a respective bit line is electrically conductively connected to the cross-connections which are present successively along the bit line in each case in next but one interspaces between the word lines.

An oxide layer may be provided as the first boundary layer, a nitride layer may be provided as the storage layer, and an oxide layer may be provided as the second boundary layer. Tungsten, in particular, is suitable as the electrically conductive material introduced between the word lines.

This method has the advantage that, in the region of the remaining portions of the electrically conductive material, in particular of the cross-connections, the electrical insulation at the lateral walls of the word lines is not attached as a result of contact holes being etched out, into which contact holes the electrically conductive material is subsequently introduced in each case. Dielectric spacers provided at the sidewalls of the word lines thus retain their initial thickness, thereby ensuring a sufficient electrical insulation between the word lines and the rest of the electrically conductive material. In this way, the top-side bit lines and the special arrangement of the transistor structures that is formed by the cross-connections can be fabricated in a simple manner. The memory cells can thereby be packed very densely in a memory cell array.

This method additionally makes it possible, in a simple manner, to fabricate high-contrast, in particular metallic, alignment marks, in particular at the periphery of the memory cell array. The layer sequence used for the word lines may be patterned for this purpose as a mark border, the inner volume of which is filled with the electrically conductive material, in particular with tungsten. The alignment marks thus formed provide a better contrast upon the application of a hard mask in later method steps.

BRIEF DESCRIPTION OF THE DRAWINGS

Examples of the method are described in more detail below with reference to FIGS. 1 to 5.

FIG. 3 shows a configuration of a mask for patterning the electrically conductive material;

FIG. 4 shows the circuit scheme of the arrangement fabricated according to the method; and FIG. 5 shows a cross section through an arrangement of an alignment mark which can be fabricated according to the method.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
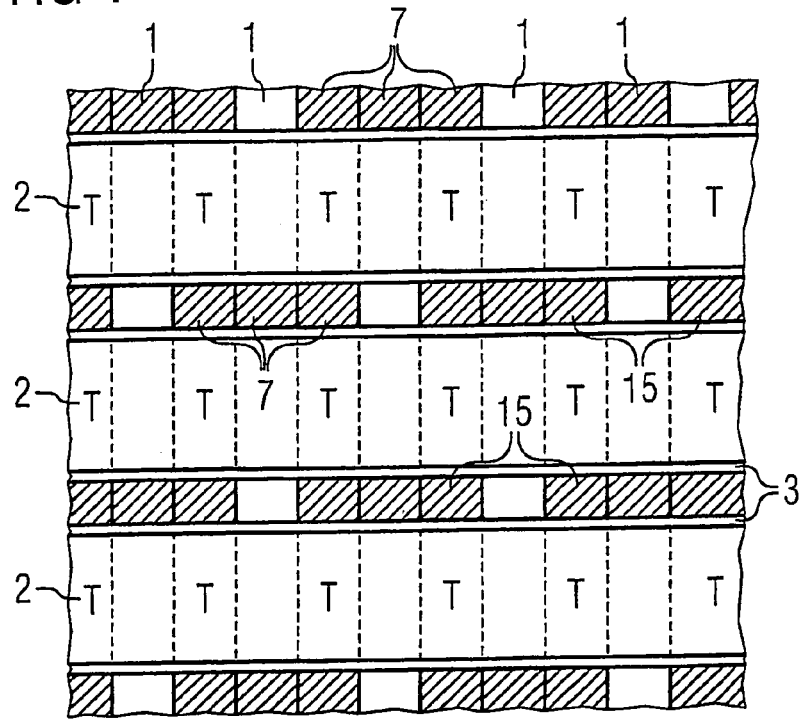
FIG. 1 shows a preferred arrangement scheme of the STI isolations and word lines.

FIG. 1 shows, for an exemplary embodiment, a plan view of a scheme revealing the positions of the STI isolations 1, word lines 2 with lateral spacers 3 and the regions that are to be electrically conductively connected to one another. The STI isolations 1 (shallow trench isolation) are isolation trenches which are arranged parallel at a distance from one another and filled with dielectric and between which there are, in each case, channel regions of the transistors T that run parallel to the isolation trenches below each word line 2. The word lines 2 therefore, run over the channel regions arranged transversely with respect to the longitudinal direction of the word line. The source/drain regions 15 of the transistors T are, in each case, present in a manner laterally adjoining the word lines 2. The source/drain regions 15 are electrically conductively coupled to one another in the regions that are, in each case, identified in hatched fashion in FIG. 1, a short piece of the relevant isolation trench being bridged in each case. The regions that are identified in hatched fashion are, in each case, filled with a residual portion 7 of the electrically insulating material introduced. Dielectric material is introduced inbetween. In the example illustrated in FIG. 1, the residual portions 7 therefore, in each case, form cross-connections across the isolation trenches (STI isolations 1).

Figure 2:
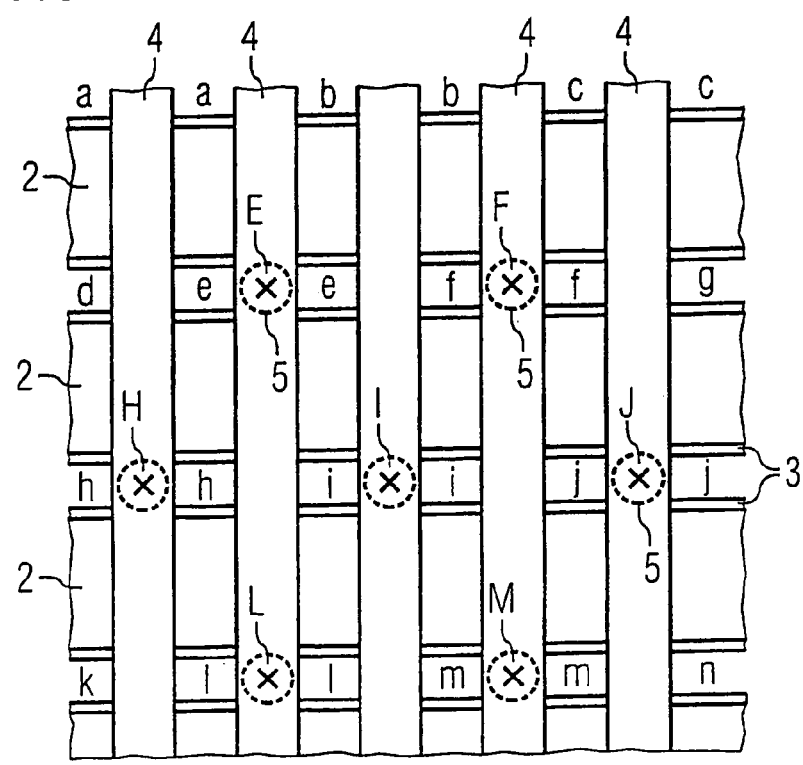
FIG. 2 shows a preferred arrangement scheme of the word lines and bit lines.

FIG. 2 illustrates a plan view of the arrangement in accordance with FIG. 1 including the bit lines 4 applied above the word lines 2. The regions depicted in hatched fashion in FIG. 1 are, in each case, designated by the same lower-case letters in FIG. 2. The residual portions 7 of the electrically insulating material introduced that are, in each case, present there form cross-connections and are contact-connected by the bit lines 4. The bit line contacts 5 are depicted by broken lines as concealed contours in FIG. 2 and identified by an "x". Furthermore, the bit line contacts 5 are, in each case, identified by that upper-case letter which corresponds to the lower-case letter of the relevant cross-connection. It can be seen in FIG. 2 that the bit lines 4 are, in each case, electrically contact-connected at cross-connections which are arranged successively in the direction of the bit lines 4, in each case, in next but one interspaces between the word lines 2.

FIG. 3 illustrates, in the corresponding plan view, the structure of a mask 6, which can be used to pattern the residual portions 7 of the electrically conductive material in accordance with the example illustrated in FIG. 1. The portions of the mask 6, which are preferably formed by photoresist, are depicted as rectangles in FIG. 3. The size of these photoresist regions may be adapted to the etching process. The mask 6 is open in sections above the STI isolations 1. The mask openings may be present, in each case, with part of the width above the word lines 2, which are covered by an insulation layer on the top side. The electrically conductive material introduced between the word lines 2, in particular into the interspaces between the spacers 3 that electrically insulate the word lines laterally, can be etched selectively with respect to the dielectric material encapsulating the word lines 2. The top-side insulation of the word lines may be a nitride, for example; the spacers are for example an oxide of the semiconductor material, for example silicon dioxide. The electrically conductive material is tungsten, for example.

During the partial etching out of the electrically conductive material, the dielectric material encapsulating the word lines 2 is not, or only slightly, incipiently etched. Therefore, the word lines remain electrically insulated toward the outside. In particular, the full thickness of the spacers 3 is maintained between the word lines 2 and the residual portions 7 of the electrically conductive material introduced into the interspaces, so that the word lines 2 remain sufficiently electrically insulated from the residual portions of the electrically conductive material, which form the cross-connections in particular in the example shown.

Once the electrically conductive material has been partially removed using the mask 6 illustrated in FIG. 3, the openings thus fabricated can be filled with a dielectric material which insulates the cross-connections from one another. On the top side, the bit lines 4 can then be fabricated in accordance with the illustration of FIG. 2 and be contact-connected with the residual portions 7 of the electrically conductive material present between the word lines 2. With this method, it is possible to fabricate a memory cell arrangement with the maximum storage density.

FIG. 4 shows a circuit scheme of a virtual ground memory cell architecture, in which the word lines are depicted running from left to right and the bit lines from top to bottom. The longitudinal direction of the transistors from source to drain in this case runs parallel to the word lines and thus corresponds to a previously customary arrangement of the transistors in the array. The orientation of the transistors in the realization in accordance with FIGS. 1 and 2 corresponds to a shortening of the connections that are depicted bolder in FIG. 4, so that the terminal points that are respectively connected to one another there coincide. The longitudinal directions of the transistors are thus as it were drawn parallel to the bit lines.

FIG. 5 shows a cross section with a layer sequence provided for the word lines on the top side of a semiconductor substrate or wafer. Situated on the top side of the semiconductor material is the storage layer sequence 8, which may be an oxide-nitride-oxide storage layer, for example, but which may in principle be any storage layer sequence suitable for charge trapping. A first word line layer 9 is polysilicon, for example. A second word line layer 10 may be provided in order to reduce the bulk resistance of the first word line layer 9. The second word line layer is tungsten/tungsten silicide, for example. Situated thereon is an insulation layer 11, which is a nitride, for example. Situated at the sidewalls of the word line webs are spacers 3, for example made of oxide, which electrically insulate the word lines laterally. The electrically conductive material is introduced between the word lines, of which material the residual portions 7 remain after patterning. Two word lines and, between them in the semiconductor material, the source/drain regions 15, are depicted as an example in the cross section of FIG. 5.

The layer sequence provided for the word lines may additionally be used for fabricating alignment marks 12, which are removed after the completion of the memory components and serve, during the fabrication process, for alignment of a mask that is applied in a later process step. In the example illustrated in FIG. 5, the layers provided for the word lines are also patterned to form mark borders 13, the inner volume of which is filled with a filling 14 made of the electrically conductive material. This material may be tungsten, for example. The mark boundary 13 is, for example, a wall enclosing a volume, preferably at right angles. The filling 14 made of electrically conductive material, in particular a metal, enables an increased contrast during the alignment of subsequently applied hard masks, for example made of polysilicon. Alignment marks configured in this way may be arranged on an in principle arbitrary semiconductor substrate or wafer in which a structure for forming a semiconductor component is present on a top side, the structure comprising an electrically conductive material, the electrically conductive material additionally forming at least a portion of such an alignment mark.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor memory having charge trapping memory cells, the method comprising:
    forming isolation regions in a semiconductor body;
    forming channel regions of memory transistors in the semiconductor body;
    forming a dielectric storage layer sequence over the channel regions, the dielectric storage layer sequence comprising a first boundary layer, a storage layer and a second boundary layer;
    applying a first electrically conductive material over the semiconductor body;
    patterning the first electrically conductive material to form word lines that run parallel at a distance from one another;
    forming source/drain regions by introducing dopant in the semiconductor body adjacent the word lines;
    introducing a second electrically conductive material between ones of the word lines; and
    partially removing the second electrically conductive material using a mask in such a way that residual portions of the second electrically conductive material fills a section of a the space between two word lines and produces an electrical contact with at least one of the source/drain regions.

2. The method as claimed in claim 1 and further comprising introducing dielectric material into interspaces between the word lines and the residual portions of the second electrically conductive material.

3. The method as claimed in claim 2 wherein, the residual portions of the second electrically concuive material are arranged in such a way that, in accordance with a consecutive numbering of the source/drain regions along a respective word line, in the case of which source/drain regions, which are not arranged on different sides of an STI isolation, each acquire the same number, wherein:
    on one side of the word line in each case an even-numbered source/drain region is electrically conductively connected to the subsequent odd-numbered source/drain region in said numbering, and
    on the opposite side of this word line, in each case an odd-numbered source/drain region is electrically conductively connected to the subsequent even-numbered source/drain region in said numbering.

4. The method as claimed in claim 3, and further comprising applying third electrically conductive material in strip form for the purpose of forming bit lines that are arranged parallel at a distance from one another and transversely with respect to the word lines and is contact-connected with the second electrically conductive material in such a way that a respective bit line is electrically conductively connected to the portions of said electrically conductive material which are present successively along the bit line in each case in next but one interspaces between the word lines.

5. The method as claimed in claim 1 wherein the first boundary layer comprises an oxide layer, the storage layer comprises a nitride layer, and the second boundary layer comprises an oxide layer.

6. The method as claimed in claim 1 wherein the first electrically conductive material is additionally patterned to form portions of an alignment mark, and the second electrically conductive material is also patterned to form further portions of the alignment mark.

7. The method as claimed in claim 6 wherein first electrically conductive material is patterned to form a mark border and wherein the second electrically conductive material is introduced as filling into a volume surrounded by the mark border.

8. The method as claimed in claim 1 the second electrically conductive material comprises tungsten.

9. A method for fabricating a semiconductor memory having charge trapping memory cells, in which:
    in a first step, at a top side of a semiconductor body or substrate, in an arbitrary order, a concentration of dopant that suffices for forming channel regions of memory transistors is provided and strip-type STI isolations arranged parallel at a distance from one another are fabricated;
    in a second step, a dielectric storage layer sequence comprising a first boundary layer, a storage layer and a second boundary layer is applied over the semiconductor body or substrate;
    in a third step, electrically conductive material is applied and patterned together with a top-side insulation layer to form word lines, which run parallel at a distance from one another transversely with respect to the STI isolations;
    in a fourth step, the word lines are electrically insulated laterally and source/drain regions are fabricated by introducing dopant between the STI isolations and the word lines; and
    in a fifth step, electrically conductive material is introduced into interspaces between the word lines and is partially removed using a mask in such a way that residual portions of the electrically conductive material in each case fill a section of the relevant interspace and produce an electrical contact with in each case at least one of the source/drain regions.

10. The method as claimed in claim 9, in which, in a sixth step, dielectric material is in each case introduced into interspaces between the word lines and the residual portions of the electrically conductive material.

11. The method as claimed in claim 10, in which,
in the fifth step, the residual portions of the electrically conducive material are arranged in such a way that, in accordance with a consecutive numbering of the source/drain regions along a respective word line, in the case of which the source/drain regions which are not arranged on different sides of an STI isolation each acquire the same number,
 a) on one side of the word line in each case an even-numbered source/drain region is electrically conductively connected to the subsequent odd-numbered source/drain region in said numbering, and
 b) on the opposite side of this word line, in each case an odd-numbered source/drain region is electrically conductively connected to the subsequent even-numbered source/drain region in said numbering.

12. The method as claimed in claim 11, in which, in a seventh step, electrically conductive material is applied in strip form for the purpose of forming bit lines which are arranged parallel at a distance from one another and transversely with respect to the word lines and is contact-connected with the electrically conductive material introduced in the fifth step in such a way that a respective bit line is electrically conductively connected to the portions of said electrically conductive material which are present successively along the bit line in each case in next but one interspaces between the word lines.

13. The method as claimed in claim 9, in which, in the second step, an oxide layer is fabricated as the first boundary layer, a nitride layer is fabricated as the storage layer, and an oxide layer is fabricated as the second boundary layer.

14. The method as claimed in claim 9, in which,
in the third step, the electrically conductive material and the insulation layer are additionally patterned to form portions of an alignment mark, and
in the fifth step, the electrically conductive material is also patterned to form further portions of the alignment mark.

15. The method as claimed in claim 14, in which,
in the third step, the portions of the alignment part are patterned as mark border, and
in the fifth step, the electrically conductive material is introduced as filling into a volume surrounded by the mark border.

16. The method as claimed in claim 9, in which, in the fifth step, tungsten is introduced as electrically conductive material.

* * * * *

UNITED STATES PATENT AND TRADEMARK OFFICE
CERTIFICATE OF CORRECTION

PATENT NO. : 7,015,095 B2
DATED : March 21, 2006
INVENTOR(S) : Krause et al.

It is certified that error appears in the above-identified patent and that said Letters Patent is hereby corrected as shown below:

Column 5,
Line 61, delete "the" and insert -- a --.

Column 6,
Line 2, delete "conducive" and insert -- conductive --.

Column 7,
Line 10, delete "conducive" and insert -- conductive --.

Signed and Sealed this

Sixth Day of June, 2006

JON W. DUDAS
*Director of the United States Patent and Trademark Office*